US008096205B2

(12) United States Patent
Okamoto et al.

(10) Patent No.: US 8,096,205 B2
(45) Date of Patent: Jan. 17, 2012

(54) GEAR

(75) Inventors: Yusuke Okamoto, Kanagawa (JP);
Yoshiteru Yasuda, Yokohama (JP);
Takuro Yamaguchi, Yokohama (JP);
Makoto Kano, Yokohama (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 12/177,943

(22) Filed: Jul. 23, 2008

(65) Prior Publication Data
US 2008/0276755 A1   Nov. 13, 2008

Related U.S. Application Data

(62) Division of application No. 10/902,303, filed on Jul. 30, 2004, now abandoned.

(30) Foreign Application Priority Data

Jul. 31, 2003   (JP) .................................. 2003-204238
Apr. 23, 2004   (JP) .................................. 2004-127632

(51) Int. Cl.
*F16H 57/04* (2010.01)

(52) U.S. Cl. ........................................ 74/468; 184/6.12
(58) Field of Classification Search .................... 74/467, 74/468, 460, 464; 184/6.12; 508/113; 475/344
See application file for complete search history.

(56) References Cited

U.S. PATENT DOCUMENTS

| | | | |
|---|---|---|---|
| 1,461 A | 12/1839 | Day | |
| 2,339,715 A * | 1/1944 | Woods et al. ................. | 508/532 |
| 2,609,342 A * | 9/1952 | Clark et al. ................... | 508/167 |
| 2,716,972 A | 9/1955 | Famy et al. | |
| 2,982,733 A | 5/1961 | Wright et al. | |
| 3,211,647 A | 10/1965 | O'Halloran et al. | |
| 3,790,315 A | 2/1974 | Emanuelsson et al. | |
| 3,846,162 A | 11/1974 | Bloom | |
| 3,932,228 A | 1/1976 | Sugiyama et al. | |
| 4,031,023 A | 6/1977 | Musser et al. | |
| 4,367,130 A | 1/1983 | Lemelson | |
| 4,385,880 A | 5/1983 | Lemelson | |
| 4,538,929 A | 9/1985 | Ehrentraut et al. | |
| 4,554,208 A | 11/1985 | MacIver et al. | |
| 4,645,610 A | 2/1987 | Born et al. | |
| 4,702,808 A | 10/1987 | Lemelson | |
| 4,712,982 A | 12/1987 | Inagaki et al. | |
| 4,755,237 A | 7/1988 | Lemelson | |
| 4,755,426 A | 7/1988 | Kokai et al. | |
| 4,783,368 A | 11/1988 | Yamamoto et al. | |
| 4,834,400 A | 5/1989 | Lebeck | |
| 4,842,755 A | 6/1989 | Dunn | |
| 4,859,493 A | 8/1989 | Lemelson | |
| 4,874,596 A | 10/1989 | Lemelson | |
| 4,919,974 A | 4/1990 | McCune et al. | |
| 4,933,058 A | 6/1990 | Bache et al. | |
| 4,943,345 A | 7/1990 | Asmussen et al. | |
| 4,960,643 A | 10/1990 | Lemelson | |
| 4,974,498 A | 12/1990 | Lemelson | |
| 4,980,021 A | 12/1990 | Kitamura et al. | |
| 4,980,610 A | 12/1990 | Varga | |
| 4,981,717 A | 1/1991 | Thaler | |
| 4,988,421 A | 1/1991 | Drawl et al. | |
| 4,992,082 A | 2/1991 | Drawl et al. | |
| 5,000,541 A | 3/1991 | DiMarcello et al. | |
| 5,021,628 A | 6/1991 | Lemelson | |
| 5,032,243 A | 7/1991 | Bache et al. | |
| 5,036,211 A | 7/1991 | Scott | |
| 5,040,501 A | 8/1991 | Lemelson | |
| 5,067,826 A | 11/1991 | Lemelson | |
| 5,077,990 A | 1/1992 | Plath | |
| 5,078,848 A | 1/1992 | Anttila et al. | |
| 5,087,608 A | 2/1992 | Chan et al. | |
| 5,096,352 A | 3/1992 | Lemelson | |
| 5,110,435 A | 5/1992 | Haberland | |
| 5,112,025 A | 5/1992 | Nakayama et al. | |
| 5,127,314 A | 7/1992 | Swain | |
| 5,131,941 A | 7/1992 | Lemelson | |
| 5,132,587 A | 7/1992 | Lemelson | |
| 5,142,785 A | 9/1992 | Grewal et al. | |
| 5,143,634 A | 9/1992 | Quinga et al. | |
| 5,148,780 A | 9/1992 | Urano et al. | |
| 5,187,021 A | 2/1993 | Vydra et al. | |
| 5,190,807 A | 3/1993 | Kimock et al. | |
| 5,190,824 A | 3/1993 | Itoh | |

(Continued)

FOREIGN PATENT DOCUMENTS

CA         2009582         8/1990

(Continued)

OTHER PUBLICATIONS

U.S. Appl. No. 10/911,741, Ueno, filed May 5, 2004.
Gaålin, Rickard et al., "ME-C:H Coatings in Motor Vehicles," *WEAR* 249, 2001, pp. 302-309.
Hershberger, J., et al., "Evaluation of DLC Coatings for Spark-Ignited, Direct-Injected Fuel Systems," *Surface & Coatings Technology*, 179, 2004, pp. 237-244.
Hershberger, J, et al., "Friction and Wear Behavior of Near-Frictionless Carbon Coatings in Formulated Gasolines," *Surface & Coating Technology*, 183, 2004, pp. 111-117.
Kovalchenko, A., et al., "Friction and Wear Performance of Low-Friction Carbon Coatings Under Oil Lubrication," Energy Technology Div., Argonne National Laboratory.

(Continued)

*Primary Examiner* — Richard W Ridley
*Assistant Examiner* — Terence Boes
(74) *Attorney, Agent, or Firm* — Foley & Lardner LLP

(57) ABSTRACT

A gear comprised of a tooth surface and a hard carbon film formed on at least a part of the tooth surface. When the gear is used in lubricant including a specific component, a friction of a tooth surface of the gear is largely decreased, and therefore the gear performs an excellent power transmission efficiency. Further, when the gear is employed in a planetary gear mechanism or speed reducing mechanism which has a plurality of meshing portions of gears, the power transmission efficiency of the mechanism is also improved.

4 Claims, No Drawings

U.S. PATENT DOCUMENTS

| | | |
|---|---|---|
| 5,202,156 A | 4/1993 | Yamamoto et al. |
| 5,205,188 A | 4/1993 | Repenning et al. |
| 5,205,305 A | 4/1993 | Yamakita |
| H1210 H | 7/1993 | Jansen |
| 5,232,568 A | 8/1993 | Parent et al. |
| 5,237,967 A | 8/1993 | Willermet et al. |
| 5,249,554 A | 10/1993 | Tamor et al. |
| 5,255,783 A | 10/1993 | Goodman et al. |
| 5,255,929 A | 10/1993 | Lemelson |
| 5,284,394 A | 2/1994 | Lemelson |
| 5,288,556 A | 2/1994 | Lemelson |
| 5,295,305 A | 3/1994 | Hahn et al. |
| 5,299,937 A | 4/1994 | Gow |
| 5,317,938 A | 6/1994 | de Juan, Jr. et al. |
| 5,326,488 A | 7/1994 | Minokami et al. |
| 5,332,348 A | 7/1994 | Lemelson |
| 5,334,306 A | 8/1994 | Dautremont-Smith et al. |
| 5,349,265 A | 9/1994 | Lemelson |
| 5,358,402 A | 10/1994 | Reed et al. |
| 5,359,170 A | 10/1994 | Chen et al. |
| 5,360,227 A | 11/1994 | Lemelson |
| 5,380,196 A | 1/1995 | Kelly et al. |
| 5,401,543 A | 3/1995 | O'Neill et al. |
| H1461 H | 7/1995 | DiVita et al. |
| 5,432,539 A | 7/1995 | Anderson |
| 5,433,977 A | 7/1995 | Sarin et al. |
| H1471 H | 8/1995 | Braun et al. |
| 5,443,032 A | 8/1995 | Vichr et al. |
| 5,447,208 A | 9/1995 | Lund et al. |
| 5,456,406 A | 10/1995 | Lemelson |
| 5,458,754 A | 10/1995 | Sathrum et al. |
| 5,461,648 A | 10/1995 | Nauflett et al. |
| 5,462,772 A | 10/1995 | Lemelson |
| 5,464,667 A | 11/1995 | Köhler et al. |
| 5,466,431 A | 11/1995 | Dorfman et al. |
| 5,479,069 A | 12/1995 | Winsor |
| 5,482,602 A | 1/1996 | Cooper et al. |
| 5,491,028 A | 2/1996 | Sarin et al. |
| 5,497,550 A | 3/1996 | Trotta et al. |
| 5,509,841 A | 4/1996 | Winsor |
| 5,516,729 A | 5/1996 | Dawson et al. |
| 5,529,815 A | 6/1996 | Lemelson |
| 5,531,878 A | 7/1996 | Vadgama et al. |
| 5,541,566 A | 7/1996 | Deeney |
| 5,547,716 A | 8/1996 | Thaler |
| 5,551,959 A | 9/1996 | Martin et al. |
| 5,552,675 A | 9/1996 | Lemelson |
| 5,568,391 A | 10/1996 | Mckee |
| 5,593,719 A | 1/1997 | Dearnaley et al. |
| 5,616,372 A | 4/1997 | Conley et al. |
| 5,619,889 A | 4/1997 | Jones et al. |
| 5,628,881 A | 5/1997 | Lemelson |
| 5,630,275 A | 5/1997 | Wexler |
| 5,630,953 A | 5/1997 | Klink |
| 5,641,731 A | 6/1997 | Baumgart et al. |
| 5,653,300 A | 8/1997 | Lund et al. |
| 5,669,144 A | 9/1997 | Hahn et al. |
| 5,672,054 A | 9/1997 | Cooper et al. |
| 5,688,557 A | 11/1997 | Lemelson et al. |
| 5,707,409 A | 1/1998 | Martin et al. |
| 5,714,202 A | 2/1998 | Lemelson et al. |
| 5,719,109 A | 2/1998 | Tokashiki et al. |
| 5,723,207 A | 3/1998 | Lettington et al. |
| 5,731,046 A | 3/1998 | Mistry et al. |
| 5,735,769 A | 4/1998 | Takemura et al. |
| 5,740,941 A | 4/1998 | Lemelson |
| 5,775,817 A | 7/1998 | Gottemoller et al. |
| 5,786,038 A | 7/1998 | Conley et al. |
| 5,790,146 A | 8/1998 | Anderson |
| 5,793,390 A | 8/1998 | Claflin et al. |
| 5,794,801 A | 8/1998 | Lemelson |
| 5,799,549 A | 9/1998 | Decker et al. |
| 5,806,557 A | 9/1998 | Helge |
| 5,824,387 A | 10/1998 | Boutaghou et al. |
| 5,834,708 A | 11/1998 | Svetal et al. |
| 5,840,662 A | 11/1998 | Nibert et al. |
| 5,843,571 A | 12/1998 | Sho |
| 5,851,962 A | 12/1998 | Kaga |
| 5,866,195 A | 2/1999 | Lemelson |
| 5,871,805 A | 2/1999 | Lemelson |
| 5,881,444 A | 3/1999 | Schaefer et al. |
| 5,901,021 A | 5/1999 | Hirano et al. |
| 5,910,940 A | 6/1999 | Guerra |
| 5,927,897 A | 7/1999 | Attar |
| 5,937,812 A | 8/1999 | Reedy et al. |
| 5,939,149 A | 8/1999 | Jang et al. |
| 5,940,975 A | 8/1999 | Decker et al. |
| 5,945,214 A | 8/1999 | Ma et al. |
| 5,947,710 A | 9/1999 | Cooper et al. |
| 5,952,102 A | 9/1999 | Cutler |
| 5,958,261 A | 9/1999 | Offer et al. |
| 5,960,762 A | 10/1999 | Imai |
| 5,967,250 A | 10/1999 | Lund et al. |
| 5,968,596 A | 10/1999 | Ma et al. |
| 5,975,686 A | 11/1999 | Hauck et al. |
| 5,976,707 A | 11/1999 | Grab |
| 5,992,268 A | 11/1999 | Decker et al. |
| 5,993,938 A | 11/1999 | Tsukuda et al. |
| 6,006,415 A | 12/1999 | Schaefer et al. |
| 6,015,597 A | 1/2000 | David |
| 6,016,000 A | 1/2000 | Moslehi |
| 6,023,979 A | 2/2000 | Bills et al. |
| 6,028,393 A | 2/2000 | Izu et al. |
| 6,051,298 A | 4/2000 | Ko et al. |
| 6,056,443 A | 5/2000 | Koike et al. |
| 6,059,460 A | 5/2000 | Ono et al. |
| 6,059,830 A | 5/2000 | Lippincott, III et al. |
| 6,071,597 A | 6/2000 | Yang et al. |
| 6,083,313 A | 7/2000 | Venkatraman et al. |
| 6,083,570 A | 7/2000 | Lemelson et al. |
| 6,095,690 A | 8/2000 | Niegel et al. |
| 6,099,541 A | 8/2000 | Klopotek |
| 6,099,976 A | 8/2000 | Lemelson et al. |
| 6,100,628 A | 8/2000 | Coll et al. |
| 6,106,919 A | 8/2000 | Lee et al. |
| 6,124,198 A | 9/2000 | Moslehi |
| 6,139,964 A | 10/2000 | Sathrum et al. |
| 6,142,481 A | 11/2000 | Iwashita et al. |
| 6,145,608 A | 11/2000 | Lund et al. |
| 6,156,439 A | 12/2000 | Coffinberry |
| 6,159,558 A | 12/2000 | Wolfe et al. |
| 6,160,683 A | 12/2000 | Boutaghou |
| 6,165,616 A | 12/2000 | Lemelson et al. |
| 6,170,156 B1 * | 1/2001 | Lev et al. ............ 29/893.1 |
| 6,171,343 B1 | 1/2001 | Dearnaley et al. |
| 6,173,913 B1 | 1/2001 | Shafer et al. |
| 6,190,514 B1 | 2/2001 | Ma et al. |
| 6,193,906 B1 | 2/2001 | Kaneko et al. |
| 6,197,120 B1 | 3/2001 | David |
| 6,197,428 B1 | 3/2001 | Rogers |
| 6,203,651 B1 | 3/2001 | Järvenkylä et al. |
| 6,205,291 B1 | 3/2001 | Hughes et al. |
| 6,207,625 B1 | 3/2001 | Ogano et al. |
| 6,227,056 B1 | 5/2001 | Bills et al. |
| 6,237,441 B1 | 5/2001 | Nishioka et al. |
| 6,237,852 B1 | 5/2001 | Svetal et al. |
| 6,238,839 B1 | 5/2001 | Tomita et al. |
| 6,255,262 B1 | 7/2001 | Keenan et al. |
| 6,261,424 B1 | 7/2001 | Goncharenko et al. |
| 6,273,793 B1 | 8/2001 | Liners et al. |
| 6,274,220 B1 | 8/2001 | Tsukuda et al. |
| 6,289,593 B1 | 9/2001 | Decker et al. |
| 6,293,648 B1 | 9/2001 | Anderson |
| 6,296,552 B1 | 10/2001 | Boutaghou et al. |
| 6,299,425 B1 | 10/2001 | Hirano et al. |
| 6,303,547 B1 | 10/2001 | Balasubramaniam |
| 6,305,416 B1 | 10/2001 | Snel et al. |
| 6,309,283 B1 | 10/2001 | Liners et al. |
| 6,311,524 B1 | 11/2001 | Brennan, III et al. |
| 6,316,392 B1 | 11/2001 | Heimann et al. |
| 6,316,734 B1 | 11/2001 | Yang |
| 6,322,431 B1 | 11/2001 | Schaenzer et al. |
| 6,322,719 B2 | 11/2001 | Kaneko et al. |
| 6,324,060 B1 | 11/2001 | Hsu |
| 6,325,385 B1 | 12/2001 | Iwashita et al. |
| 6,329,328 B1 | 12/2001 | Koganei et al. |
| 6,333,298 B1 | 12/2001 | Waddoups et al. |

| | | | | | | |
|---|---|---|---|---|---|---|
| 6,338,881 | B1 | 1/2002 | Sellschopp et al. | 6,861,098 B2 | 3/2005 | Griffin et al. |
| 6,340,245 | B1 | 1/2002 | Horton et al. | 6,861,137 B2 | 3/2005 | Griffin et al. |
| 6,358,123 | B1 | 3/2002 | Liners et al. | 6,865,952 B2 | 3/2005 | Bills et al. |
| 6,367,705 | B1 | 4/2002 | Lee et al. | 6,866,894 B2 | 3/2005 | Trankiem et al. |
| 6,368,676 | B1 | 4/2002 | Gaudreau et al. | 6,871,700 B2 | 3/2005 | Gorokhovsky |
| 6,377,422 | B1 | 4/2002 | Boutaghou et al. | 6,872,203 B2 | 3/2005 | Shafirstein et al. |
| 6,379,383 | B1 | 4/2002 | Palmaz et al. | 6,878,447 B2 | 4/2005 | Griffin et al. |
| 6,385,987 | B2 | 5/2002 | Schlom et al. | 6,880,469 B2 | 4/2005 | Frost |
| 6,386,468 | B1 | 5/2002 | Neuberger et al. | 6,882,094 B2 | 4/2005 | Dimitrijevic et al. |
| 6,399,215 | B1 | 6/2002 | Zhu et al. | 6,883,476 B1 | 4/2005 | Nohara et al. |
| 6,401,058 | B1 | 6/2002 | Akalin et al. | 6,886,521 B2 | 5/2005 | Hamada et al. |
| 6,439,845 | B1 | 8/2002 | Veres | 6,887,585 B2 | 5/2005 | Herbst-Dederichs |
| 6,439,986 | B1 | 8/2002 | Myoung et al. | 6,890,700 B2 | 5/2005 | Tomita et al. |
| 6,452,752 | B1 | 9/2002 | Boutaghou | 6,893,720 B1 | 5/2005 | Nakahigashi et al. |
| 6,465,399 | B2 | 10/2002 | Koishikawa et al. | 6,969,198 B2 | 11/2005 | Konishi et al. |
| 6,468,642 | B1 | 10/2002 | Bray et al. | 7,086,362 B2 | 8/2006 | Mabuchi et al. |
| 6,471,979 | B2 | 10/2002 | New et al. | 2001/0036800 A1 | 11/2001 | Liners et al. |
| 6,494,881 | B1 | 12/2002 | Bales et al. | 2002/0026899 A1 | 3/2002 | McLaughlin et al. |
| 6,523,456 | B1 | 2/2003 | Kobayashi et al. | 2002/0031987 A1 | 3/2002 | Liners et al. |
| 6,524,212 | B2 | 2/2003 | Ushijima et al. | 2002/0034631 A1 | 3/2002 | Griffin et al. |
| 6,534,141 | B1 | 3/2003 | Hull, Jr. et al. | 2002/0034632 A1 | 3/2002 | Griffin et al. |
| 6,537,310 | B1 | 3/2003 | Palmaz et al. | 2002/0051286 A1 | 5/2002 | Blitstein |
| 6,537,429 | B2 | 3/2003 | O'Donnell et al. | 2002/0055440 A1 | 5/2002 | Balasubramaniam |
| 6,543,394 | B2 | 4/2003 | Tinney | 2002/0070357 A1 | 6/2002 | Kim et al. |
| 6,544,308 | B2 | 4/2003 | Griffin et al. | 2002/0074168 A1 | 6/2002 | Matthias et al. |
| 6,553,957 | B1 | 4/2003 | Ishikawa et al. | 2002/0089571 A1 | 7/2002 | Lee et al. |
| 6,557,968 | B2 | 5/2003 | Lee et al. | 2002/0090155 A1 | 7/2002 | Ushijima et al. |
| 6,562,445 | B2 | 5/2003 | Iwamura | 2002/0090578 A1 | 7/2002 | Schaefera et al. |
| 6,562,462 | B2 | 5/2003 | Griffin et al. | 2002/0130219 A1 | 9/2002 | Parseghian et al. |
| 6,570,172 | B2 | 5/2003 | Kim et al. | 2002/0148430 A1 | 10/2002 | Kano et al. |
| 6,572,651 | B1 | 6/2003 | DeScheerder et al. | 2002/0155015 A1 | 10/2002 | Esumi et al. |
| 6,572,935 | B1 | 6/2003 | He et al. | 2002/0175476 A1 | 11/2002 | Chinou et al. |
| 6,572,937 | B2 | 6/2003 | Hakovirta et al. | 2003/0012234 A1 | 1/2003 | Watson et al. |
| 6,585,064 | B2 | 7/2003 | Griffin et al. | 2003/0019111 A1 | 1/2003 | Korb et al. |
| 6,586,069 | B2 | 7/2003 | Dykes et al. | 2003/0019332 A1 | 1/2003 | Korb et al. |
| 6,589,640 | B2 | 7/2003 | Griffin et al. | 2003/0021995 A1 | 1/2003 | Griffin et al. |
| 6,592,519 | B1 | 7/2003 | Martinez | 2003/0034182 A1 | 2/2003 | Griffin et al. |
| 6,592,985 | B2 | 7/2003 | Griffin et al. | 2003/0035957 A1 | 2/2003 | Griffin et al. |
| 6,601,662 | B2 | 8/2003 | Matthias et al. | 2003/0035958 A1 | 2/2003 | Griffin et al. |
| 6,626,949 | B1 | 9/2003 | Townley | 2003/0036341 A1 | 2/2003 | Myoung et al. |
| 6,629,906 | B1 | 10/2003 | Chiba et al. | 2003/0037640 A1 | 2/2003 | Griffin et al. |
| 6,637,528 | B2 | 10/2003 | Nishiyama et al. | 2003/0069632 A1 | 4/2003 | De Scheerder et al. |
| 6,638,569 | B2 | 10/2003 | McLaughlin et al. | 2003/0108777 A1 | 6/2003 | Gunsel et al. |
| 6,645,354 | B1 | 11/2003 | Gorokhovsky | 2003/0114094 A1 | 6/2003 | Myoung et al. |
| 6,656,329 | B1 | 12/2003 | Ma et al. | 2003/0128903 A1 | 7/2003 | Yasuda et al. |
| 6,658,941 | B1 | 12/2003 | Bills et al. | 2003/0159919 A1 | 8/2003 | Fairbairn et al. |
| 6,666,328 | B2 | 12/2003 | Sykora | 2003/0162672 A1 | 8/2003 | Shirahama et al. |
| 6,666,671 | B1 | 12/2003 | Olver et al. | 2003/0168323 A1 | 9/2003 | Frost |
| 6,684,513 | B1 | 2/2004 | Clipstone et al. | 2003/0180565 A1 | 9/2003 | Herbst-Dederichs |
| 6,684,759 | B1 | 2/2004 | Gorokhovsky | 2003/0199741 A1 | 10/2003 | Martinez |
| 6,695,865 | B2 | 2/2004 | Boyle et al. | 2003/0234371 A1 | 12/2003 | Ziegler |
| 6,699,706 | B1 | 3/2004 | Myoung et al. | 2003/0235691 A1 | 12/2003 | Griffin et al. |
| 6,701,627 | B2 | 3/2004 | Korb et al. | 2004/0003638 A1 | 1/2004 | Schaefer et al. |
| 6,715,693 | B1 | 4/2004 | Dam et al. | 2004/0008406 A1 | 1/2004 | Blitstein |
| 6,726,993 | B2 | 4/2004 | Teer et al. | 2004/0010068 A1 | 1/2004 | Doren et al. |
| 6,729,350 | B2 | 5/2004 | Schick | 2004/0011900 A1 | 1/2004 | Gebhardt et al. |
| 6,729,527 | B2 | 5/2004 | Sonnenreich et al. | 2004/0027018 A1 | 2/2004 | LeBlanc et al. |
| 6,733,513 | B2 | 5/2004 | Boyle et al. | 2004/0035375 A1 | 2/2004 | Gibisch et al. |
| 6,739,214 | B2 | 5/2004 | Griffin et al. | 2004/0074467 A1 | 4/2004 | Hamada et al. |
| 6,739,238 | B2 | 5/2004 | Ushijima et al. | 2004/0092405 A1 | 5/2004 | Konishi et al. |
| 6,740,393 | B1 | 5/2004 | Massler et al. | 2004/0105806 A1 | 6/2004 | Griffin et al. |
| 6,745,742 | B2 | 6/2004 | Meyer | 2004/0109621 A1 | 6/2004 | Frost |
| 6,749,033 | B2 | 6/2004 | Griffin et al. | 2004/0115435 A1 | 6/2004 | Griffin et al. |
| 6,753,042 | B1 | 6/2004 | Bakounine et al. | 2004/0133301 A1 | 7/2004 | Van Doren et al. |
| 6,753,635 | B2 | 6/2004 | Kuhlmann-Wilsdorf | 2004/0154570 A1 | 8/2004 | Mabuchi et al. |
| 6,761,532 | B2 | 7/2004 | Capone et al. | 2004/0168326 A1 | 9/2004 | Korb et al. |
| 6,761,736 | B1 | 7/2004 | Woo et al. | 2004/0184687 A1 | 9/2004 | Morales et al. |
| 6,780,177 | B2 | 8/2004 | Shafirstein et al. | 2004/0223256 A1 | 11/2004 | Feng et al. |
| 6,797,326 | B2 | 9/2004 | Griffin et al. | 2004/0241448 A1 | 12/2004 | Kano et al. |
| 6,799,468 | B2 | 10/2004 | Borenstein | 2004/0242435 A1 | 12/2004 | Nishimura et al. |
| 6,806,242 | B2 | 10/2004 | Shirahama et al. | 2004/0244539 A1 | 12/2004 | Korb et al. |
| 6,818,029 | B2 | 11/2004 | Myoung et al. | 2004/0261614 A1 | 12/2004 | Hamada et al. |
| 6,820,676 | B2 | 11/2004 | Palmaz et al. | 2005/0001201 A1 | 1/2005 | Bocko et al. |
| 6,821,189 | B1 | 11/2004 | Coad et al. | 2005/0005892 A1 | 1/2005 | Nishimura et al. |
| 6,821,624 | B2 | 11/2004 | Utsumi et al. | 2005/0035222 A1 | 2/2005 | Hamada et al. |
| 6,822,788 | B2 | 11/2004 | Blitstein | 2005/0037879 A1 | 2/2005 | Murata et al. |
| 6,849,085 | B2 | 2/2005 | Marton | 2005/0056241 A1 | 3/2005 | Nomura et al. |
| 6,855,237 | B2 | 2/2005 | Kolpakov et al. | 2005/0061291 A1 | 3/2005 | Nishimura et al. |
| 6,855,791 | B2 | 2/2005 | Van Doren et al. | 2005/0061636 A1 | 3/2005 | Frost et al. |

| | | | |
|---|---|---|---|
| 2005/0064196 A1 | 3/2005 | Martin et al. | |
| 2005/0082139 A1 | 4/2005 | Ishikawa et al. | |
| 2005/0084390 A1 | 4/2005 | Ueno et al. | |
| 2005/0089685 A1 | 4/2005 | Hamada et al. | |
| 2005/0098134 A1 | 5/2005 | Nishimura et al. | |
| 2005/0100701 A1 | 5/2005 | Hamada et al. | |
| 2005/0115744 A1 | 6/2005 | Griffin et al. | |
| 2005/0188942 A1 | 9/2005 | Hamada et al. | |

FOREIGN PATENT DOCUMENTS

| | | |
|---|---|---|
| CN | 87101001 A | 10/1988 |
| CN | 1077736 A | 10/1993 |
| CN | 1166864 A | 12/1997 |
| CN | 1171809 A | 1/1998 |
| CN | 1046759 C | 11/1999 |
| CN | 1385552 A | 12/2002 |
| DE | 643 034 | 3/1937 |
| DE | 19507086 A1 | 9/1996 |
| DE | 19507086 C2 | 9/1996 |
| DE | 197 04 224 | 8/1997 |
| DE | 198 15 989 | 10/1999 |
| DE | 198 25 860 | 12/1999 |
| DE | 19825860 A1 | 12/1999 |
| DE | 100 17 459 | 10/2000 |
| DE | 100 61 397 A1 | 5/2002 |
| DE | 101 58 683 | 6/2003 |
| DE | 103 18 135 | 11/2003 |
| DE | 10337559 A1 | 3/2005 |
| EP | 0 286 996 | 10/1988 |
| EP | 0 291 006 A2 | 11/1988 |
| EP | 0 299 785 | 1/1989 |
| EP | 0308143 A1 | 3/1989 |
| EP | 0 333 416 | 9/1989 |
| EP | 1109196 A1 | 5/1990 |
| EP | 0378378 B1 | 7/1990 |
| EP | 0384772 A1 | 8/1990 |
| EP | 0388800 A2 | 9/1990 |
| EP | 0392125 A1 | 10/1990 |
| EP | 0398985 B1 | 11/1990 |
| EP | 407977 | 1/1991 |
| EP | 0 435 312 | 7/1991 |
| EP | 0474369 A1 | 3/1992 |
| EP | 0 500 253 | 8/1992 |
| EP | 0511153 A1 | 10/1992 |
| EP | 0 529 327 | 3/1993 |
| EP | 0392125 B1 | 3/1993 |
| EP | 0546824 A1 | 6/1993 |
| EP | 0308143 A1 | 11/1993 |
| EP | 0573943 A1 | 12/1993 |
| EP | 0619504 A1 | 10/1994 |
| EP | 0621136 A2 | 10/1994 |
| EP | 0624353 A3 | 11/1994 |
| EP | 0624354 A3 | 11/1994 |
| EP | 0378378 B1 | 1/1995 |
| EP | 0651069 A1 | 5/1995 |
| EP | 0652301 A1 | 5/1995 |
| EP | 0656458 A3 | 6/1995 |
| EP | 0 661 470 | 7/1995 |
| EP | 0396603 B1 | 6/1996 |
| EP | 0388800 B1 | 12/1996 |
| EP | 0 759 519 | 2/1997 |
| EP | 0474369 B1 | 3/1997 |
| EP | 0 818 622 | 1/1998 |
| EP | 0652301 B1 | 1/1998 |
| EP | 0826790 A1 | 3/1998 |
| EP | 10-088369 A2 | 4/1998 |
| EP | 0842754 A1 | 5/1998 |
| EP | 0 870 820 | 10/1998 |
| EP | 0816112 A3 | 10/1998 |
| EP | 0882759 A1 | 12/1998 |
| EP | 0893677 B1 | 1/1999 |
| EP | 0624353 B1 | 2/1999 |
| EP | 0656458 B1 | 2/1999 |
| EP | 0 905 221 A1 | 3/1999 |
| EP | 0 905 419 | 3/1999 |
| EP | 0647318 B1 | 3/1999 |
| EP | 0651069 B1 | 3/1999 |
| EP | 0 731 190 B1 | 5/1999 |
| EP | 0949200 A1 | 10/1999 |
| EP | 0845154 B1 | 11/1999 |
| EP | 0582676 B1 | 3/2000 |
| EP | 1063085 A1 | 12/2000 |
| EP | 1 067 211 | 1/2001 |
| EP | 0850126 B1 | 1/2001 |
| EP | 1076087 A1 | 2/2001 |
| EP | 1078736 A1 | 2/2001 |
| EP | 0778902 B1 | 9/2001 |
| EP | 1 154 012 | 11/2001 |
| EP | 0826790 B1 | 11/2001 |
| EP | 1034320 B1 | 12/2001 |
| EP | 0893677 B1 | 1/2002 |
| EP | 1184480 A2 | 3/2002 |
| EP | 1190791 A3 | 4/2002 |
| EP | 1219464 A2 | 7/2002 |
| EP | 1 233 054 A1 | 8/2002 |
| EP | 0971812 B1 | 10/2002 |
| EP | 1018291 B1 | 10/2002 |
| EP | 1281513 A2 | 2/2003 |
| EP | 1 300 608 | 4/2003 |
| EP | 0850133 B1 | 5/2003 |
| EP | 0950123 B1 | 5/2003 |
| EP | 0882759 B1 | 6/2003 |
| EP | 1 338 641 | 8/2003 |
| EP | 1340605 A1 | 9/2003 |
| EP | 1365141 A1 | 11/2003 |
| EP | 1083946 B1 | 12/2003 |
| EP | 1078736 B1 | 1/2004 |
| EP | 1378271 A1 | 1/2004 |
| EP | 0757615 B1 | 3/2004 |
| EP | 0842754 B1 | 3/2004 |
| EP | 1 411 145 | 4/2004 |
| EP | 0862395 B1 | 4/2004 |
| EP | 1 418 353 A2 | 5/2004 |
| EP | 1440775 A1 | 7/2004 |
| EP | 1445119 A1 | 8/2004 |
| EP | 1475557 A1 | 11/2004 |
| EP | 1481699 A1 | 12/2004 |
| EP | 1482190 A2 | 12/2004 |
| EP | 1498597 A1 | 1/2005 |
| EP | 1 510 594 A2 | 3/2005 |
| EP | 1311885 B1 | 3/2005 |
| EP | 1512781 A2 | 3/2005 |
| EP | 1183470 B1 | 4/2005 |
| FR | 2 669 689 | 5/1992 |
| GB | 768226 | 2/1957 |
| GB | 1005638 | 10/1988 |
| GB | 0624354 B1 | 12/1999 |
| GB | 2338716 | 12/1999 |
| IE | 0990532 A1 | 3/2001 |
| JP | 62-111106 | 5/1987 |
| JP | 63-21209 A2 | 1/1988 |
| JP | 63-288994 A2 | 11/1988 |
| JP | 02-189393 A | 7/1990 |
| JP | 5-70879 | 3/1993 |
| JP | 5-36004 | 5/1993 |
| JP | 5-42616 | 6/1993 |
| JP | 6-264993 | 9/1994 |
| JP | 06-293891 A | 10/1994 |
| JP | 6-294307 A | 10/1994 |
| JP | 7-63135 | 3/1995 |
| JP | 07-090553 A | 4/1995 |
| JP | 7-103238 | 4/1995 |
| JP | 07-118832 | 5/1995 |
| JP | 7-41386 A2 | 10/1995 |
| JP | 7-286696 | 10/1995 |
| JP | 07-305082 A | 11/1995 |
| JP | 8-14014 | 1/1996 |
| JP | 8-61499 | 3/1996 |
| JP | 9-20981 A2 | 1/1997 |
| JP | 52006318 | 1/1997 |
| JP | 253770 | 9/1997 |
| JP | 10-265790 | 10/1998 |
| JP | 10-298440 A2 | 11/1998 |
| JP | 11-22423 | 1/1999 |
| JP | 11-190406 | 7/1999 |
| JP | 11-292629 A2 | 10/1999 |
| JP | 11-294118 | 10/1999 |
| JP | 11-333773 A2 | 12/1999 |

| | | | | | |
|---|---|---|---|---|---|
| JP | 2000-02315 A | 1/2000 | WO | WO 00/28142 A1 | 5/2000 |
| JP | 2000-88104 | 3/2000 | WO | WO 00/33051 A1 | 6/2000 |
| JP | 2000-119843 | 4/2000 | WO | WO 00/35000 A1 | 6/2000 |
| JP | 2000-504089 | 4/2000 | WO | WO 00/44032 A1 | 7/2000 |
| JP | 2000-297373 | 10/2000 | WO | WO 00/47402 A1 | 8/2000 |
| JP | 2000-327484 | 11/2000 | WO | WO 00/55385 A1 | 9/2000 |
| JP | 2000-339083 | 12/2000 | WO | WO 00/56127 A1 | 9/2000 |
| JP | 2001-62605 | 3/2001 | WO | WO 00/56393 A1 | 9/2000 |
| JP | 2001-64005 | 3/2001 | WO | WO 00/62327 A2 | 10/2000 |
| JP | 2001-93141 A2 | 4/2001 | WO | WO 00/68451 A2 | 11/2000 |
| JP | 2001-172766 A2 | 6/2001 | WO | WO 00/75517 A1 | 12/2000 |
| JP | 2001-192864 | 7/2001 | WO | WO 00/78504 A1 | 12/2000 |
| JP | 2001-269938 | 10/2001 | WO | WO 01/05917 | 1/2001 |
| JP | 2001-280236 | 10/2001 | WO | WO 01/06033 A1 | 2/2001 |
| JP | 2001-316686 A | 11/2001 | WO | WO 01/14736 A1 | 3/2001 |
| JP | 2002-265968 A2 | 9/2002 | WO | WO 01/14745 A1 | 3/2001 |
| JP | 2002-309912 | 10/2002 | WO | WO 01/26862 A1 | 4/2001 |
| JP | 2002-332571 | 11/2002 | WO | WO 01/37631 A2 | 5/2001 |
| JP | 2003-13163 | 1/2003 | WO | WO 01/40537 A1 | 6/2001 |
| JP | 2003-13799 | 1/2003 | WO | WO 01/47451 A1 | 7/2001 |
| JP | 2003-25117 | 1/2003 | WO | WO 01/59544 A2 | 8/2001 |
| JP | 2003-28174 A2 | 1/2003 | WO | WO 01/61182 | 8/2001 |
| JP | 2003-88939 | 3/2003 | WO | WO 01/61719 A1 | 8/2001 |
| JP | 2003-105368 A | 4/2003 | WO | WO 01/62372 A1 | 8/2001 |
| JP | 2003-113941 | 4/2003 | WO | WO 01/63639 A1 | 8/2001 |
| JP | 2003-147508 | 5/2003 | WO | WO 01/67834 A1 | 9/2001 |
| JP | 2004-36788 A2 | 2/2004 | WO | WO 01/79583 A2 | 10/2001 |
| JP | 2004-217110 A | 8/2004 | WO | WO 01/80224 A2 | 10/2001 |
| JP | 2005-68529 A2 | 3/2005 | WO | WO 02/006875 A1 | 1/2002 |
| RU | 2004586 C1 | 12/1993 | WO | WO 02/13188 A1 | 2/2002 |
| RU | 2153782 C1 | 7/2000 | WO | WO 02/24601 A1 | 3/2002 |
| SU | 1770350 A1 | 10/1992 | WO | WO 02/24603 A1 | 3/2002 |
| WO | WO 89/06707 A1 | 7/1989 | WO | WO 02/24970 A2 | 3/2002 |
| WO | WO 89/06708 A1 | 7/1989 | WO | WO 02/32625 A2 | 4/2002 |
| WO | WO 8906338 A1 | 7/1989 | WO | WO 02/44440 A1 | 6/2002 |
| WO | WO 92/02602 | 2/1992 | WO | WO 02/054454 A2 | 7/2002 |
| WO | WO 9206843 A1 | 4/1992 | WO | WO 02/062714 A1 | 8/2002 |
| WO | WO 9219425 A2 | 4/1992 | WO | WO 02/062714 A2 | 8/2002 |
| WO | WO 93/21288 | 10/1993 | WO | WO 02/073021 | 9/2002 |
| WO | WO 93/21289 | 10/1993 | WO | WO 02/080996 A1 | 10/2002 |
| WO | WO 9324828 A1 | 12/1993 | WO | WO 02/085237 A2 | 10/2002 |
| WO | WO 95/29273 A1 | 2/1995 | WO | WO 02/090461 A1 | 11/2002 |
| WO | WO 95/20253 A2 | 7/1995 | WO | WO 02/097289 A1 | 12/2002 |
| WO | WO 95/29044 A1 | 11/1995 | WO | WO 03/009978 A1 | 2/2003 |
| WO | WO 95/31584 A1 | 11/1995 | WO | WO 03/013990 A1 | 2/2003 |
| WO | WO 96/04485 | 2/1996 | WO | WO 03/020329 A1 | 3/2003 |
| WO | WO 96/05333 A1 | 2/1996 | WO | WO 03/021731 A1 | 3/2003 |
| WO | WO 96/05942 A1 | 2/1996 | WO | WO 03/031543 A2 | 4/2003 |
| WO | WO 96/06961 A1 | 3/1996 | WO | WO 03/091758 A2 | 5/2003 |
| WO | WO 96/12389 A1 | 4/1996 | WO | WO 03/046508 A3 | 6/2003 |
| WO | WO 96/24488 A1 | 8/1996 | WO | WO 03/054876 A1 | 7/2003 |
| WO | WO 96/40446 A1 | 12/1996 | WO | WO 03/076309 A2 | 9/2003 |
| WO | WO 97/07531 A1 | 2/1997 | WO | WO 03/078679 A1 | 9/2003 |
| WO | WO 97/10093 A1 | 3/1997 | WO | WO 03/091758 A2 | 11/2003 |
| WO | WO 97/10940 A1 | 3/1997 | WO | WO 03/095009 A1 | 11/2003 |
| WO | WO 97/14555 A1 | 4/1997 | WO | WO 03/105134 A1 | 12/2003 |
| WO | WO 97/16138 A1 | 5/1997 | WO | WO 2004/001804 A2 | 12/2003 |
| WO | WO 98/02715 A1 | 1/1998 | WO | WO 2004/004998 A1 | 1/2004 |
| WO | WO 98/12994 A1 | 4/1998 | WO | WO 2004/019809 A2 | 3/2004 |
| WO | WO 98/13528 A1 | 4/1998 | WO | WO 2004/024206 A1 | 3/2004 |
| WO | WO 98/47141 A1 | 10/1998 | WO | WO 2004/026359 A1 | 4/2004 |
| WO | WO 99/09547 A1 | 2/1999 | WO | WO 2004/026500 A1 | 4/2004 |
| WO | WO 99/12404 A1 | 3/1999 | WO | WO 2004/036169 A1 | 4/2004 |
| WO | WO 99/14512 A1 | 3/1999 | WO | WO 2004/036292 A2 | 4/2004 |
| WO | WO 99/16371 A1 | 4/1999 | WO | WO 2004/038701 A2 | 5/2004 |
| WO | WO 99/22694 A2 | 5/1999 | WO | WO 2004/043631 A1 | 5/2004 |
| WO | WO 99/27157 A1 | 6/1999 | WO | WO 2004/048126 A1 | 6/2004 |
| WO | WO 99/29477 A1 | 6/1999 | WO | WO 2004/067466 A1 | 8/2004 |
| WO | WO 99/31557 A1 | 6/1999 | WO | WO 2004/068530 A1 | 8/2004 |
| WO | WO 99/34385 A1 | 7/1999 | WO | WO 2004/071670 A1 | 8/2004 |
| WO | WO 99/46847 A1 | 9/1999 | WO | WO 2004/072959 A2 | 8/2004 |
| WO | WO 99/54520 A1 | 10/1999 | WO | WO 2004/078424 A2 | 9/2004 |
| WO | WO 99/54934 A1 | 10/1999 | WO | WO 2004/084773 A1 | 10/2004 |
| WO | WO 99/57743 A1 | 11/1999 | WO | WO 2004/088113 A1 | 10/2004 |
| WO | WO 99/62077 A1 | 12/1999 | WO | WO 2005/010596 A2 | 2/2005 |
| WO | WO 99/62572 A1 | 12/1999 | WO | WO 2005/011744 A2 | 2/2005 |
| WO | WO 00/22613 A1 | 4/2000 | WO | WO 2005/014760 A1 | 2/2005 |
| WO | WO 00/24554 A1 | 5/2000 | WO | WO 2005/014882 A1 | 2/2005 |
| WO | WO 00/25410 A1 | 5/2000 | WO | WO 2005/016620 A2 | 2/2005 |

| WO | WO 2005/021851 A1 | 3/2005 |
| WO | WO 2005/025844 A1 | 3/2005 |
| WO | WO 2005/034791 A1 | 4/2005 |
| WO | WO 2005/037144 A2 | 4/2005 |
| WO | WO 2005/037985 A2 | 4/2005 |
| WO | WO 2005/040451 A1 | 5/2005 |
| WO | WO 2005/042064 A1 | 5/2005 |
| WO | WO 2005/047737 A1 | 5/2005 |

OTHER PUBLICATIONS

Ajayi, O., et al., "Effect of Carbon Coating on Scuffing Performance in Diesel Fuels," *Tribology Transactions*, vol. 44, 2001, pp. 298-304.

Ajayi, O., et al., Effect of Thin-Film Coating on Wear in EGR-Contaminated Oil, Energy Technology Div., Argonne National Laboratory.

Fujimori, N., et al., "Characterization of Conducting Diamond Films," *Vacuum*, vol. 36, Nos. 1-3, 1996, pp. 99-102.

Patent/Literature Search Report, Bawa Biotechnology Consulting, LLC, Jun. 3, 2005 (201 pages).

Japanese Industrial Standard Handbook, "Machine Elements", 2003, pp. 262-286 and 2586.

E. Meyer-Rassler, "Neuartige Lauffllächen-Schutzverfahren füu Kolben von Verbrennungsmotoren—New Types of Processes for Providing the Friction Surfaces of Internal Combustion Engine Pistons with Protection Against Wear", VDI-Zeitchrift Bd. 86 Nr. 15/16, Apr. 18, 1942, pp. 245-247.

"Aluminium Alloy Die Castings," Japanese Industrial Standard (JIS H 5302), 2000, pp. 1-12.

"Aluminium Alloys Castings", Japanese Industrial Standard (JIS H 5202), 1999 (18 pages).

Japanese Industrial Standard, "Aluminium Alloy Castings", JIS H 5202, 1999, pp. 1910, 1911 and 1636-1647.

"Aluminum Alloy Die Castings," JIS H5302 (2000), pp. 1670-1681.

"Assessment of 2nd to 5th Order Irregularities of Surface Configuration by Means of Sections of Surfaces Definitions Relating to Reference System and Dimensions," DIN 4762, UDC 621-288:001.4 (Aug. 1960), pp. 1-4.

API Motor Oil Guide, "Which Oil is Right for You", American Petroleum Institute, Copyright 2002.

"Carbon Steels for Machine Structural Use", Japanese Industrial Standard (JIS G 4051), 1979, pp. 1381-1383.

"Carbon Steels for Machine Structural Use", Japanese Industrial Standard (JIS G 4051), 1979, pp. 1-10.

"Chromium Molybdenum Steels," Japanese Industrial Standard (JIS G 4105), 1979, pp. 1-11 (with Translation).

"Chromium Steels," Japanese Industrial Standard (JIS G 4104), 1979, pp. 1-9.

D.G. Watson et al., "Engineering Drawing Practice," XP002281300, University of Hertfordshire, Sep. 1991, p. 29, Figure 38.

Database WPI, Nov. 28, 2000, Derwent Publications, Ltd., AN 2000640583, XP002240184, JP 2000-327484, Nov. 28, 2000.

Dr. Marx, "Surfaces and Contact Mechanics", XP-002233233, Google, Retrieved from the Internet, Mar. 3, 2003, pp. 1-18.

Engine Oil Viscosity Classification—SAE J300 revised Apr. 1997, p. 133.

"Geometrical Product Specifications (GPS)—Surface Texture: Profile Method—Terms, Definitions and Surface Texture Parameters," International Standard, ISO 4287, TC 213 (1997), pp. 1-25.

"Grey iron castings", Japanese Industrial Standard (JIS G 5501), pp. 2075-2077.

Japanese Industrial Standard, "High Carbon Chromium Bearing Steels", JIS G 4805, 1999, pp. 1-31 (with translation).

International Standard "Application of Carbides for Machining by Chip Removal—Designation of the Main Groups of Chip Removal and Groups of Application," ISO 513, (1975), pp. 67-69.

International Standard, "Petroleum products—Determination of base number—Perchloric acid potentiometric titration method", ISO 3771, second edition Aug. 15, 1994, pp. 1-8.

Japanese Industrial Standard, "Structural Steels with Specified Hardenability Bands", JIS G 4052, 1979, pp. 2414, 2415, 1390-1403, 1410 and 1411.

JIS Japanese Industrial Standard; "Surface Roughness—Definitions and Designation"; JIS B 0601; 1994. (w/Translation).

JIS Japanese Industrial Standard; "Vickers Hardness Test—Test Method"; JIS Z 2244; 1998; (w/Translation).

Japanese Industrial Standard, 2001, No. B 0601.

K. Holmberg et al., "Tribological Characteristics of Diamond-like Carbon Coatings," VTT Symposium, Technical Research Centre of Finland, XP000570636, 1994, pp. 24-238.

Kano et al., "Friction Characteristics of a Hard Carbon Film in Engine Oil, (No. 2) (Surface Analysis Result of Sliding Surface)," Japan Tribology Congress 1999, 5, pp. 11-12.

M. Kano et al., "The Effect of ZDDP and MODTC Additives on Friction Properties of DLC and Steel Cam Follower in Engine Oil", Abstracts of Papers from 2nd World Tribology Congress, Sep. 3-7, 2001, p. 342.

Patent Abstracts of Japan, vol. 1996, No. 09, Sep. 30, 1996, JP 08-128448, May 21, 1996.

Patent Abstracts of Japan, vol. 2000, No. 01, Jan. 31, 2000, JP 11-287329, Oct. 19, 1999.

Patent Abstracts of Japan, vol. 2000, No. 09, Oct. 13, 2000, JP 2000-170768, Jun. 20, 2000.

PCT/IB2004/002552.

"Stainless Steel Bars", Japanese Industrial Standard (JIS G 4303), pp. 1457-1477.

"Standard Practice for Codification of Certain Nonferrous Metals and Alloys, Cast and Wrought1", ASTM International, Designation: B 275-02, Jun. 2002, pp. 1-7.

"Standard Test Method for Calibration and Operation of the Falex Block-on-Ring Friction and Wear Testing Machine", ASTM Designation: D2714-88, Jan. 1989, pp. 383-386.

"Standard Test Method for Separation of Representative Aromatics and Nonaromatics Fractions of High-Boiling Oils by Elution Chromatography", ASTM Designation: D 2549-91 (Reapproved 1995), pp. 895-900.

Steve J. Bull et al., "High-Performance Diamond and Diamond-like Coatings", JOM, Apr. 1995, pp. 16-19, vol. 47, No. 4, XP 000500980.

Patent Abstracts of Japan, vol. 2003, No. 12, Dec. 5, 2003, JP 2004-155891, Jun. 3, 2004.

Japanese Industrial Standard Handbook, "Machine Elements", 2003, pp. 262-286 and 2586.

E. Meyer-Rassler, "Neuartige Lauffllächen-Schutzverfahren für Kolben von Verbrennungsmotoren—New Types of Processes for Providing the Friction Surfaces of Internal Combustion Engine Pistons with Protection Against Wear", VDI-Zeitchrift Bd. 86 Nr. 15/16, Apr. 18, 1942, pp. 245-247.

Ronkainen, Helena, "Tribological Properties of Hydrogenated and Hydrogen-Free Diamond-Like Carbon Coatings," Dissertation for the Degree of Doctor of Science in Technology, VTT Publications No. 434.

Japanese Office Action mailing date of Dec. 11, 2009 for Japanese Application No. 2004-127632 (5 pgs).

Kano, M. et al., "Ultralow friction of DLC in presence of glycerol mono-oleate (GMO)," 18 Tribology Lett. 245 (2005).

* cited by examiner

GEAR

CROSS-REFERENCE TO RELATED APPLICATIONS

The present application is a divisional of U.S. application Ser. No. 10/902,303, filed Jul. 30, 2004, the entire contents of which is incorporated herein by reference.

This application has the following related applications: U.S. patent application Ser. Nos. 09/545,181 based on Japanese Patent Application Hei-11-102205 filed on Apr. 9, 1999; Ser. No. 10/468,713 which is the designated state (United States) application number of PCT Application JP02/10057 based on Japanese Patent Application 2001-117680 filed on Apr. 17, 2001; Ser. No. 10/355,099 based on Japanese Patent Application 2002-45576 filed on Feb. 22, 2002; Ser. No. 10/682,559 based on Japanese Patent Application No. 2002-302205 filed on Oct. 16, 2002; and Ser. No. 10/692,853 based on Japanese Patent Application 2002-322322 filed on Oct. 16, 2002.

BACKGROUND OF THE INVENTION

The present invention relates a gear for a power transmission mechanism, and more particularly to a gear which improves a transmission efficiency.

Generally, gears have been employed in various power transmission mechanisms. Representative gears for vehicle transmission mechanisms are mainly made by steel, such as carburized steel, carbonitrided steel, and chromium molybdenum steel.

SUMMARY OF THE INVENTION

Such gears for vehicle transmission mechanisms are required to reduce friction generated at the mesh between the gears in order to improve an output power and a fuel consumption of a vehicle. More specifically, there are a large number of meshes of gears in a planetary mechanism or speed reduction mechanism, and therefore, it has been strongly desired to decrease the frictions at the meshes of the gears in view of improving a power transmission efficiency of such mechanisms.

It is therefore an object of the present invention to provide an improved gear which performs an excellent power transmission efficiency by decreasing friction on the tooth surface of the gear.

An aspect of the present invention resides in a gear which comprises a tooth surface and a hard carbon film formed on at least a part of the tooth surface.

The other objects and features of this invention will become understood from the following description with reference to the accompanying drawings.

DETAILED DESCRIPTION OF THE INVENTION

Gears are generally slidingly contacted with each other during the revolution under an engaged (meshed) state with other gear. Therefore, reducing friction at tooth surfaces of gears is preferable in view of improving a power transmission efficiency of the gears.

A gear of the present invention is constructed such that a hard carbon film (coating) is formed on at least a part of the gear. This hard carbon film is a film of amorphous carbon or hydrogen containing amorphous carbon which is referenced as a-C:H (amorphous carbon or hydrogen containing amorphous carbon), i-C (i carbon) and DLC (diamond-like carbon).

It is known that such a hard carbon film has a low friction coefficient when slides on the other surface under a dry condition (no lubricating condition). Although the principle of having such a low friction coefficient has not been completely elucidated, it can be assumed that a solid lubrication performance and properties such as a low Young's modulus and a high hardness of the hard carbon film attain the reduction of the friction coefficient.

On the other hand, when the hard carbon film is used in lubricant, the friction coefficient of the film in lubricant becomes different from that in the dry condition. A normal hard carbon film is made of carbon and unavoidable impurity, or of carbon, hydrogen and unavoidable impurity. A reactivity of a surface of the hard carbon film is low, and this property relates to a low-friction and a low-abrasion thereof. However, since the hard carbon film has a weak interaction relative to a base oil and additives in lubricant, a reduction merit of the friction coefficient in lubricant is relatively small as compared with that in the dry condition.

The present invention has been achieved by thorough study as to a hard carbon film having a low-friction coefficient in lubricant, a preferable lubricant, and an additive component.

First, a hard carbon film is formed on a tooth surface of a gear. The hard carbon film may be formed on a whole surface of the tooth surface of the gear or a partial surface of the tooth surface. Generally, there is a tendency that a forming of a film on a bottom portion of each gear tooth is not easy as compared with that on a top portion of each gear tooth. However, it is not necessary to forcibly form the hard carbon film on the uneasy forming portion, since the merit obtained by the hard carbon film is obtained according to a ratio of the film formed area. Further, even if a part of the film is worn out in use, the merit of the hard carbon film is maintained according to a size of the remaining hard carbon film.

Although gears are actually used by combining two or more gears, the hard carbon film may be formed on the whole of the tooth surface or may be formed on a part of the tooth surface. A film forming area of the hard carbon film may be properly determined upon taking account of a production cost, a productivity and a degree of the obtained merit.

Although a base metal of the gear is not basically limited, a carburized steel and a chromium molybdenum steel are preferably used to ensure an impact strength and a bending fatigue strength necessary for a gear. Further, carbonitrided steel is preferably used to suppress the softening of the base metal due to the semi-high-temperature condition during the film production process. An intermediate layer may be formed between the base metal and the hard carbon film to decrease the strain between the base metal and the hard carbon film and to improve the adherence of the film relative to the base metal. A commonly known method may be employed to form the intermediate layer.

The hard carbon film can be produced by a chemical vapor deposition (CVD) process or physical vapor deposition (PVD) process. Generally, a hard carbon film formed by CVD process contains hydrogen due to raw materials of organic compound, and the hydrogen amount of such produced film ranges from 15 to 40 atom % (atomic percent). On the other hand, PVD process is capable of producing the hard carbon film with and/or without hydrogen. Various processes of PVD have been proposed and put in practical use. The hard carbon film of the gear according to the present invention is preferable to be formed by means of an arc ion plating or spattering, in view of the adherence of the film on the base metal.

It is preferable that the hydrogen amount in the hard carbon film for the gear is as small as possible since the decrease of the hydrogen amount in the hard carbon film decreases the friction of the gear. Therefore, the hydrogen amount of the hard carbon film of the gear according to the present invention is set to be smaller than 1 atom %, and preferably smaller than 0.3 atom %. That is, it is preferable that the hard carbon film is formed by means of physical vapor deposition (PVC) process. The hydrogen amount in the hard carbon film is capable of being measured by a secondary ion mass spectroscopy (SIMS) or Rutherford backscattering spectroscopy (RBS).

The gear according to the present invention exhibits an excellent characteristic, particularly when it is used in or with lubricant. When the gear according to the present invention is used in lubricant, the lubricant may be properly selected from a lubricant using mineral oil or synthetic oil as base oil, such as gear oil, vehicle engine oil, turbine oil and spindle oil. Further, when poly-α-olefin is used as base oil of the lubricant, the friction decreasing merit is further improved. The reason thereof may be thought to be that poly-α-olefin oil has a property of easy adherence (deposition) onto the hard carbon film formed on the tooth surface of the gear.

Further, it is preferable that a compound including hydroxy group is added to lubricant as an additive, to further improve the friction reducing merit. The reason thereof is guessed that the said additive adheres on to the hard carbon film on the tooth surface of the gear through the hydroxy group. Further, it is preferable that the number of the hydroxy groups included in a molecular of the additive is as large as possible, in view of increasing the adsorption strength. However, if the number of the hydroxy groups is too large, there causes a possibility that the additive is separated from the base oil due to the excessive hydrophilicity. Therefore, the molecular structure of the additive should be designed upon taking account of the above-discussed points. Further it is preferable that the molecular structure of the additive is designed such that the hydroxy groups are located as near as possible in the molecular structure in case that the number of the hydroxy groups in one molecular is the same. A typical molecular for the additive is secondary alcohol (dihydric alcohol) and tertiary alcohol (trihydric alcohol). Although the additive amount of the additive may be properly varied according to a usage pattern of the lubricant relative to the gear, it is preferable that the additive amount relative to the lubricant is within a range from 0.5 to 8 weight %. If the additive amount is too small, the friction reducing merit becomes small. If too large, there is a possibility that the additive is separated from the base oil.

As an additive of the lubricant, ester is preferable, and monoester of glycerin is more preferable. It is preferable that the number of carbon atoms of fatty acid constructing glycerin monoester is greater than or equal to 8, and preferably greater than or equal to 12. If the molecule size of the fatty acid consisting the ester in the additive is small, a film directly formed on a surface of the hard carbon film due to the additive becomes too thin, and therefore the friction reducing merit is decreased thereby. Polyhydric alcohol except for glycerin may be employed as an ingredient for the fatty ester additive of the lubricant although it is disadvantageous in cost.

Generally lubricant is obtained by adding proper additives in base oil such as mineral oil or synthetic oil. However, according to the usage condition and the usage circumstance of gears, lubricant including a hydroxy compound as a main component may be used instead of the above-discussed lubricant. If the lubricant including hydroxy compound is employed, the power transmission efficiency is largely improved.

Alcohol is preferable as the above-discussed hydroxy compound, and particularly, glycerin performs a large friction reducing effect. Further, when the gear slides in ethylene glycol, the excellent friction reducing merit is ensured thereby subsequent to a case that glycerin is used as lubricant for gears.

It is not necessary to construct the whole of the lubricant by the hydroxy compound. In response to the request and in correspond to usage such as wear prevention, rust prevention, viscosity control and anti-oxidation, various known additives may be added in lubricant. The total amount of such additives in lubricant is normally set to be smaller than or equal to 15 vol. %.

Further, in case that the gear according to the present invention is employed in a mechanism having a lot of mesh portions of gears, such as a planetary gear mechanism and a speed reducing mechanism, the performance of improving the power transmission efficient thereby is clearly ensured. In case that a planetary gear mechanism is employed in a speed reduction mechanism, it is possible to obtain a large speed reduction ratio while suppressing the size of the speed reduction mechanism. However, setting the speed reduction ratio at a large value radically degrades the power transmission efficiency. Accordingly, by using the gear according to the present invention as at least one of a sun gear, planetary gears and a ring gear of a planetary gear mechanism for a speed reduction mechanism, the degradation of the power transmission efficiency in the speed reduction mechanism is suppressed.

Hereinafter, there is discussed Examples according to the present invention and Comparative Examples thereof.

EXAMPLE 1 AND COMPARATIVE EXAMPLE 1

Chromium molybdenum steel defined as SCM420H in JIS (Japan Industrial Standard) was employed as material of the gear of Example 1. The material was machined into a gear defined by the following specifications, and the carburizing, quenching and tempering processes were applied to the machined gear.

<Specifications of Gear>
Type of gear: spur gear
Module: 4 mm
Number of gear teeth: 60 (that of meshed gear: 40)
Face width: 10 mm The above discussed gear of Example 1 was surfaced and degreased. Subsequently, a hard carbon film was formed on a tooth surface of the gear of Example 1 by arc ion plating (AIP) process. A thickness of the hard carbon film at a center portion of each tooth was 1.2 μm. The hydrogen amount in the hard carbon film was 0.1 atom % (atomic percent) as a result of the measurement using a secondary ion mass spectroscopy (SIMS).

The tooth surface of the gear coated by the hard carbon film was polished to remove droplets of the hard carbon film and to smoothen the surface thereof. A surface roughness Ra of the polished tooth portion was 0.04 μm. A gear (drive gear) meshed with the film coated gear was not coated with the hard carbon film. A surface roughness Ra of a tooth surface of the meshed (counter) gear was 0.17 μm. Hereinafter, as far as it is not specifically explained, tooth portions of Examples and Comparative Examples were finished such that a surface roughness Ra of the gear coated with DLC (diamond-like carbon) ranged from 0.02 μm to 0.06 μm, and a surface roughness Ra of the gear without DLC ranged from 0.1 μm to 0.3 μm. Since it is difficult to further smoothen the surface of the gear coated with DLC by the polishing due to the property of DLC film, the gear coated with DLC was previously grinded and polished to be smoothed before DLC is formed on the surface of the gear. The surface roughness Ra is explained as $Ra_{75}$ in JIS (Japanese Industrial Standard) B0601(:2001).

The power transmission efficiency of the gear was measured using a power circulation type gear test equipment. In order to separately obtain a loss of a drive gear and bearings and a loss of the tested gear, it is necessary to execute various adaptations such as a special design of the drive gear (counter gear) and a separate measurement of the bearing loss. However, since it is possible to determine the advantages gained by the hard carbon film from the magnitude of the total loss without executing the separate detection of the losses of the total loss, the evaluations of Examples and Comparative Examples have been made from the transmission efficiency corresponding to the total loss.

More specifically, using the power circulation type gear test equipment, the total loss of the tested gear was measured under a condition that the tested gear and the counter gear were wholly soaked in poly-alfa($\alpha$)-olefin (PAO) oil and that the drive gear meshed with the tested gear was rotated at a speed of 6000 rpm (the revolution speed of the drive gear).

On the other hand, the gear of Comparative Example 1 was the same in shape and in material as that of Example 1 except that no hard carbon film was formed on the gear of Comparative Example 1. The total loss of Comparative Example 1 was measured under the condition as same as that of Example 1.

EXAMPLE 2 AND COMPARATIVE EXAMPLE 2

Chromium molybdenum steel defined as SCM440H in JIS was employed as material of the gear of Example 2. The material was machined into a gear defined by the following specifications, and the carburizing, quenching and tempering processes were applied to the machined gear.
<Specifications of Gear>
Type of gear: spur gear
Module: 2 mm
Number of gear teeth: 60 (that of meshed gear: 20)
Face width: 3 mm The above discussed gear of Example 2 was degreased and set in a vacuum chamber. A hard carbon film was formed on a tooth surface of the gear of Example 2 by arc ion plating (AIP) process in the vacuum chamber. A thickness of the hard carbon film at a center portion of each tooth was 1.4 μm. The hydrogen amount in the hard carbon film was 0.1 atom % as a result of the measurement using a secondary ion mass spectroscopy (SIMS). The tooth surface was polished to remove droplets of the hard carbon film and to smoothen the surface. A gear (drive gear) meshed with the film coated gear was not coated with the hard carbon film.

Using the power circulation type gear test equipment, the total loss of the tested gear was measured under a condition that the tested gear and the counter gear were wholly soaked in poly-alfa-olefin (PAO) oil and that the tested gear meshed with the drive gear was rotated at a speed of 6000 rpm (the revolution speed of the drive gear). A kinetic viscosity of the employed poly-alfa-olefin was 4.0 cSt at 100° C. Hereinafter, the evaluation of examples and comparative examples was executed using the poly-alfa-olefin as same as that employed in Example 2.

On the other hand, the gear of Comparative Example 2 was the same in shape and in material as that of Example 2 except that no hard carbon film was formed on the gear of Comparative Example 2. The total loss of Comparative Example 2 was measured under the condition as same as that of Example 2.

EXAMPLE 3 AND COMPARATIVE EXAMPLE 3

Chromium molybdenum steel defined as SCM420H in JIS (Japan Industrial Standard) was employed as material of the gear of Example 3. The material was machined into a gear defined by the following specifications, and the carburizing, quenching and tempering processes were applied to the machined gear. Thereafter, a finishing touch was applied to the processed gear.
<Specifications of Gear>
Type of gear: spur gear
Module: 6 mm
Number of gear teeth: 120 (that of meshed gear: 40)
Face width: 12 mm The above discussed gear of Example 3 was degreased and set in a vacuum chamber. A hard carbon film was formed on a tooth surface of the gear of Example 3 by arc ion plating (AIP) process in the vacuum chamber. A thickness of the hard carbon film at a center portion of each tooth was 0.9 μm. The hydrogen amount in the film was 0.2 atom % as a result of the measurement using a secondary ion mass spectroscopy (SIMS). The tooth surface was polished to remove droplets of the hard carbon film and to smoothen the surface. A gear (drive gear) meshed with the coated gear was not coated with the hard carbon film.

Using the power circulation type gear test equipment, the total loss of the tested gear was measured under a condition that the tested gear and the counter gear were wholly soaked in poly-alfa-olefin (PAO) oil and that the tested gear meshed with the drive gear was rotated at a speed of 9000 rpm (the revolution speed of the drive gear).

On the other hand, the gear of Comparative Example 3 was the same in shape and in material as that of Example 3 except that no hard carbon film is formed on the gear of Comparative Example 3. The total loss of Comparative Example 3 was measured under the condition as same as that of Example 3.

EXAMPLE 4 AND COMPARATIVE EXAMPLE 4

Chromium molybdenum steel defined as SCM420H in JIS was employed as material of the gear of Example 4. The material was machined into a gear defined by the following specifications, and the carburizing, quenching and tempering processes were applied to the machined gear. Thereafter, a finishing touch was applied to the processed gear.
<Specifications of Gear>
Type of gear: spur gear
Module: 6 mm
Number of gear teeth: 120 (that of meshed gear: 40)
Face width: 12 mm The above discussed gear of Example 4 was degreased and set in a vacuum chamber. A hard carbon film was formed on a tooth surface of the gear of Example 4 by the magnetron spattering process in the vacuum chamber. A thickness of the hard carbon film at a center portion of each tooth was 1.3 μm. The hydrogen amount in the film was 0.1 atom % as a result of the measurement using a secondary ion mass spectroscopy (SIMS). The tooth surface was polished to remove droplets of the hard carbon film and to smoothen the surface. A gear (drive gear) meshed with the coated gear was not coated with the hard carbon film.

Using the power circulation type gear test equipment, the total loss of the tested gear was measured under a condition that the tested gear and the counter gear were wholly soaked in poly-alfa-olefin (PAO) oil and that the tested gear meshed with the drive gear was rotated at a speed of 9000 rpm (the revolution speed of the drive gear).

On the other hand, the gear of Comparative Example 4 was the same in shape and in material as that of Example 4 except that no hard carbon film was formed on the gear of Comparative Example 4. The total loss of Comparative Example 4 was measured under the condition as same as that of Example 4.

EXAMPLE 5 AND COMPARATIVE EXAMPLE 5

Chromium molybdenum steel defined as SCM440H in JIS was employed as material of the gear of Example 5. The material was machined into a gear defined by the following specifications, and the carburizing, quenching and tempering processes were applied to the machined gear. Thereafter, a finishing touch was applied to the processed gear.
<Specifications of Gear>
Type of gear: spur gear
Module: 2 mm
Number of gear teeth: 60 (that of meshed gear: 20)
Face width: 3 mm The above discussed gear of Example 5 was degreased and set in a vacuum chamber. A hard carbon film was formed on a tooth surface of the gear of Example 5 by a plasma CVD process in the vacuum chamber. Gas employed in the CVD process was cyclohexane. A thickness of the hard carbon film at a center portion of each tooth was 3.0 μm. The hydrogen amount in the hard carbon film was 25 atom % as a result of the measurement using a secondary ion mass spectroscopy (SIMS). The tooth surface was polished to remove droplets of the hard carbon film and to smoothen the surface. A gear (drive gear) meshed with the coated gear was not coated with the hard carbon film.

Using the power circulation type gear test equipment, the total loss of the tested gear was measured under a condition that the tested gear and the counter gear were wholly soaked in poly-alfa-olefin (PAO) oil and that the tested gear meshed with the drive gear was rotated at a speed of 6000 rpm (the revolution speed of the drive gear).

On the other hand, the gear of Comparative Example 5 was as same in shape and in material as that of Example 5 except that no hard carbon film is formed on the gear of Comparative Example 5. The total loss of Comparative Example 5 was measured under the condition as same as that of Example 5.

EXAMPLE 6 AND COMPARATIVE EXAMPLE 6

Chromium molybdenum steel defined as SCM420H in JIS was employed as material of the gear of Example 6. The material was machined into a gear defined by the following specifications, and the carburizing, quenching and tempering were applied to the machined gear.
<Specifications of Gear>
Type of gear: helical gear
Module corresponding to spur gear: 4 mm
Number of gear teeth: 60 (that of meshed gear: 60)
Face width: 20 mm
Helix angle: 12°

The above discussed gear of Example 6 was surfaced (finished) and degreased. Subsequently, the gear for Example 6 was set in a vacuum chamber, and a hard carbon film was formed on a tooth surface of the gear of Example 6 by arc ion plating (AIP) process in the vacuum chamber. A thickness of the film at a center portion of each tooth was 1.0 μm. The hydrogen amount in the film was 0.1 atom % as a result of the measurement using a secondary ion mass spectroscopy (SIMS).

The tooth surface was polished to remove droplets of the hard carbon film and to smoothen the surface. A gear (drive gear) meshed with the coated gear was not coated with the hard carbon film.

Using the power circulation type gear test equipment, the total loss of the tested gear was measured under a condition that the tested gear and the counter gear were wholly soaked in poly-alfa-olefin (PAO) oil and that the tested gear meshed with the drive gear was rotated at a speed of 6000 rpm (based on the drive gear).

On the other hand, the gear of Comparative Example 6 was as same in shape and in material as that of Example 6 except that no hard carbon film was formed on the gear of Comparative Example 6. The total loss of Comparative Example 6 was measured under the condition as same as that of Example 6.

EXAMPLE 7 AND COMPARATIVE EXAMPLE 7

Chromium molybdenum steel defined as SCM440H in JIS was employed as material of the gear of Example 3. The material was machined into a gear defined by the following specifications, and the carburizing, quenching and tempering processes were applied to the machined gear. Thereafter, a finishing touch was applied to the processed gear.
<Specifications of Gear>
Type of gear: spur gear
Module: 2 mm
number of gear teeth: 60 (that of meshed gear: 20)
Face width: 3 mm The above discussed gear of Example 7 was degreased and set in a vacuum chamber. A hard carbon film was formed on a tooth surface of the gear of Example 7 by arc ion plating (AIP) process in the vacuum chamber. A thickness of the hard carbon film at a center portion of each tooth was 1.1 μm. The hydrogen amount in the film was 0.1 atom % as a result of the measurement using a secondary ion mass spectroscopy (SIMS). The tooth surface was polished to remove droplets of the film and to smoothen the surface. A gear (drive gear) meshed with the coated gear was also coated with the hard carbon film. A thickness of the hard carbon film at a center portion of each tooth of the drive gear was 1.0 μm. The hydrogen amount in the hard carbon film of the drive gear was 0.1 atom %.

Using the power circulation type gear test equipment, the total loss of the tested gear was measured under a condition that the tested gear and the counter gear were wholly soaked in poly-alfa-olefin (PAO) oil and that the tested gear meshed with the drive gear was rotated at a speed of 6000 rpm (the revolution speed of the drive gear).

On the other hand, the gear of Comparative Example 7 was as same in shape and in material as that of Example 7 except that no hard carbon film is formed on the gear of Comparative Example 7. The total loss of Comparative Example 7 was measured under the condition as same as that of Example 7.

EXAMPLE 8 AND COMPARATIVE EXAMPLE 8

The gears of Example 2 and Comparative Example 2 were evaluated under the different test conditions. More specifically, lubricant employed in Example 8 and Comparative Example 8 was lubricant obtained by fully mixing an ester component which was fatty monoglyceride (a main component of fatty acid is oleic acid) of 3 weight % of the total of the lubricant with poly-alfa-olefin. The other conditions of Example 8 and Comparative Example 8 were the same as those of Example 2. The evaluation of Example 8 and Comparative Example 8 were also the same as that of Example 2.

EXAMPLE 9 AND COMPARATIVE EXAMPLE 9

The gears of Example 2 and Comparative Example 2 were evaluated under the different test conditions. More specifically, lubricant employed in Example 9 and Comparative Example 9 was lubricant obtained by fully mixing an ester component which was fatty monoglyceride (a main component of fatty acid is palmitic acid) of 2 weight % in the total of the lubricant with poly-alfa-olefin. The other conditions of Example 9 and Comparative Example 9 were the same as those of Example 2. The evaluation of Example 9 and Comparative Example 9 were also the same as that of Example 2.

EXAMPLE 10 AND COMPARATIVE EXAMPLE 10

The gears of Example 2 and Comparative Example 2 were evaluated under the different test conditions. More specifically, lubricant employed in Example 10 and Comparative Example 10 was lubricant obtained by fully mixing an ester component which was fatty monoglyceride (a main component of fatty acid is stearic acid) of 7 weight % in the total of the lubricant with poly-alfa-olefin. The other conditions of Example 10 and Comparative Example 10 were the same as those of Example 2. The evaluation of Example 10 and Comparative Example 10 were also the same as that of Example 2.

EXAMPLE 11 AND COMPARATIVE EXAMPLE 11

The gears of Example 2 and Comparative Example 2 were evaluated under the different test conditions. More specifically, Lubricant employed in Example 11 and Comparative Example 11 was lubricant obtained by fully mixing an ester component which was butyl stearate of 2 weight % in the total of the lubricant with poly-alfa-olefin. The other conditions of Example 11 and Comparative Example 11 were the same as those of Example 2. The evaluation of Example 11 and Comparative Example 11 were also the same as that of Example 2.

EXAMPLE 12 AND COMPARATIVE EXAMPLE 12

Chromium molybdenum steel defined as SCM440H in JIS (Japan Industrial Standard) was employed as material of the gears of Example 12. The material was machined into gears defined by the following specifications, and the carburizing, quenching and tempering processes were applied to the machined gears. Thereafter, a finishing touch was applied to the processed gear. The gears were assembled into a planetary gear mechanism of 2K-H type. In the evaluation of the gears, a sun gear functioning as an input gear, a ring gear was fixed, and a carrier of planetary gears functioning as an output.
  <Specifications of gear>
  Type of gear: spur gear
  Module: 2 mm
  Number of gear teeth of sun gear: 60
  Number of gear teeth of planetary gear: 24
  Number of gear teeth of ring gear: 144
  Number of planetary gears: 3
  Face width: 6 mm The sun gear and the planetary gears of Example 12 were degreased and set in a vacuum chamber. Hard carbon films were formed on tooth surfaces of the gears by arc ion plating (AIP) process in the vacuum chamber. A thickness of the film at a center portion of the sun gear was 1.7 µm. The hydrogen amount in the film was 0.1 atom % as a result of the measurement using a secondary ion mass spectroscopy (SIMS). The tooth surfaces were polished to remove droplets of the film and to smoothen the surface. The ring gear was not coated with the hard carbon film.

Using the power circulation type gear test equipment, the total loss of the tested gear was measured under a condition that the tested gears were wholly soaked in poly-alfa-olefin (PAO) oil and that the tested gear was rotated at a speed of 6000 rpm (the revolution speed of the sun gear).

On the other hand, the gears of Comparative Example 12 were the same in shape and in material as those of Example 12 except that no hard carbon film was formed on the gears of Comparative Example 12. The total loss of Comparative Example 12 was measured under the condition as same as that of Example 12.

EXAMPLE 13 AND COMPARATIVE EXAMPLE 13

The gears of Example 2 and Comparative Example 2 were evaluated under the different test conditions. More specifically, Lubricant employed in Example 13 and Comparative Example 13 was JIS industrial gear oil specified by type 2 and viscosity classification ISO VG 220. The other conditions of Example 13 and Comparative Example 13 were the same as those of Example 2. The evaluation of Example 13 and Comparative Example 13 were also the same as that of Example 2.

EXAMPLE 14 AND COMPARATIVE EXAMPLE 14

The gears of Example 2 and Comparative Example 2 were evaluated under the different test conditions. More specifically, lubricant employed in Example 14 and Comparative Example 14 was lubricant obtained by fully mixing an ester component which was fatty monoglyceride (a main component of fatty acid is stearic acid) of 5 weight % in the total of the lubricant with JIS industrial gear oil specified by viscosity classification ISO VG 220 type 2. The other conditions of Example 14 and Comparative Example 14 were the same as those of Example 2. The evaluation of Example 14 and Comparative Example 14 were also the same as that of Example 2.

EXAMPLE 15 AND COMPARATIVE EXAMPLE 15

The gears of Example 2 and Comparative Example 2 were evaluated under the different test conditions. More specifically, lubricant employed in Example 15 and Comparative Example 15 was lubricant obtained by fully mixing an ester component which was fatty monoglyceride (a main component of fatty acid is stearic acid) of 4 weight % in the total of the lubricant with JIS industrial turbine oil specified by JIS-2213K type 2. The other conditions of Example 15 and Comparative Example 15 were the same as those of Example 2. The evaluation of Example 15 and Comparative Example 15 were also the same as that of Example 2.

EXAMPLE 16 AND COMPARATIVE EXAMPLE 16

The gears of Example 7 and Comparative Example 7 were evaluated under the different test conditions. More specifically, Lubricant employed in Example 16 and Comparative Example 16 was lubricant obtained by fully mixing an ester component which was fatty monoglyceride (a main component of fatty acid is stearic acid) of 7 weight % with poly-alfa-olefin, as same as that employed in Examples 10 and 11. The other conditions of Example 16 and Comparative Example 16 were the same as those of Example 7. The evaluation of Example 16 and Comparative Example 16 were also the same as that of Example 7 and Comparative Example 7.

EXAMPLE 17 AND COMPARATIVE EXAMPLE 17

The gears of Example 2 and Comparative Example 2 were evaluated under the different test conditions. More specifically, lubricant employed in Example 17 and Comparative Example 17 was lubricant obtained by fully mixing an ester component which was fatty diglyceride (a main component of fatty acid is stearic acid) of 2 weight % with poly-alfa-olefin. The other conditions of Example 17 and Comparative Example 17 were the same as those of Example 2. The evaluation of Example 17 and Comparative Example 17 were also the same as that of Example 2.

EXAMPLE 18 AND COMPARATIVE EXAMPLE 18

The gears of Example 2 and Comparative Example 2 were evaluated under the different test conditions. More specifically, lubricant employed in Example 18 and Comparative Example 18 was lubricant obtained by fully mixing pinacol having two hydroxy groups in one molecular at 0.8 weight % with poly-alfa-olefin. The other conditions of Example 18 and Comparative Example 18 were the same as those of Example 2. The evaluation of Example 18 and Comparative Example 18 were also the same as that of Example 2.

EXAMPLE 19 AND COMPARATIVE EXAMPLE 19

The gears of Example 2 and Comparative Example 2 were evaluated under the different test conditions. More specifically, lubricant employed in Example 19 and Comparative Example 19 was lubricant obtained by fully mixing 1,10-decandiol of 2.0 weight % and poly-alfa-olefin. The other conditions of Example 19 and Comparative Example 19 were the same as those of Example 2. The evaluation of Example 19 and Comparative Example 19 were also the same as that of Example 2.

EXAMPLE 20 AND COMPARATIVE EXAMPLE 20

The gears of Example 2 and Comparative Example 2 were evaluated under the different test conditions. More specifically, lubricant employed in Example 20 and Comparative Example 20 was lubricant obtained by fully mixing dodecyl alcohol of 2.0 weight % with poly-alfa-olefin. The other conditions of Example 20 and Comparative Example 20 were the same as those of Example 2. The evaluation of Example 20 and Comparative Example 20 were also the same as that of Example 2.

EXAMPLE 21 AND COMPARATIVE EXAMPLE 21

The gears of Example 2 and Comparative Example 2 were evaluated under the different test conditions. More specifically, lubricant employed in Example 21 and Comparative Example 21 was glycerin. No additive was added in glycerin. The other conditions of Example 21 and Comparative Example 21 were the same as those of Example 2. The evaluation of Example 21 and Comparative Example 21 were also the same as that of Example 2.

EXAMPLE 22 AND COMPARATIVE EXAMPLE 22

The gears of Example 2 and Comparative Example 2 were evaluated under the different test conditions. More specifically, lubricant employed in Example 22 and Comparative Example 22 was ethylene glycol. No additive was added in ethylene glycol. The other conditions of Example 22 and Comparative Example 22 were the same as those of Example 2. The evaluation of Example 22 and Comparative Example 22 were also the same as that of Example 2.

As to Examples 1 through 22 and Comparative Examples 1 through 22, the measurement results of the power transmission efficiencies thereof were shown in Table 1 together with the specifications of the gears, such as material, module, teeth number, film forming method, hydrogen amount in the hard carbon film, and a kind of lubricant.

As is apparent from Table 1, it was recognized that the gears of Examples 1 through 22 according to the present invention performed excellent power transmission efficiencies as compared with Comparative Examples 1 through 22, respectively. Specifically, Example 21 performed the excellent power transmission efficiency. Further, Example 16 is subsequently preferable in case that the selection of lubricant is limited such that the lubricant is commonly used in the other sliding pair. In case that both of cost and power transmission efficiency are balancedly minded, Example 8 through 10 are subsequently preferable.

With the thus arranged gear according to the present invention, by film the hard carbon film on al least a part of tooth face of the gear, it becomes possible to largely decrease the friction of the gear relative to the counter gear (meshed gear). Further, by employing a specifically blended lubricant, the friction of the gear is further preferably decreased. This provides the gear further improved in power transmission efficiency. Specifically, in case that lubricant may be freely selected, a largely improved power transmission efficiency is obtained by a lubricant wherein alcohol group is used as a main component of the lubricant. Further, the gear according to the present invention is preferably adapted to a mechanism which has a lot of gear meshing portions, such as a planetary gear mechanism and speed reduction mechanism. When the gear is employed in such mechanisms, the power transmission efficiency is further improved.

TABLE 1

| | Example/Comparative Example | | | | | | | |
|---|---|---|---|---|---|---|---|---|
| | 1 | 2 | 3 | 4 | 5 | 6 | 7 | 8 |
| Material | SCM420H | SCM440H | SCM420H | SCM420H | SCM440H | SCM420H | SCM440H | SMC440H |
| Module (mm) | 4 | 2 | 6 | 2 | 2 | 4 | 2 | 2 |
| Number of Teeth | 60 | 60 | 120 | 60 | 60 | 60 helical | 60 | 60 |
| Film Forming Method | AIP | AIP | AIP | Spattering | Plasma CVD | AIP | AIP (Both Gears) | AIP |
| H amount (atom %) | 0.1 | 0.1 | 0.2 | 0.1 | 25 | 0.1 | 0.1 | 0.1 |
| Lubricant | PAO | PAO | PAO | PAO | PAO | PAO | PAO | PAO + Oleic acid monoglyceride |
| Example Transmission Efficiency (%) | 97.5 | 97.0 | 96.9 | 97.7 | 95.1 | 96.8 | 99.0 | 98.1 |
| Comp. Example Transmission Efficiency (%) | 93.3 | 93.1 | 94.2 | 93.1 | 93.1 | 94.0 | 93.1 | 94.4 |

| | Example/Comp. Example | | | | | | |
|---|---|---|---|---|---|---|---|
| | 9 | 10 | 11 | 12 | 13 | 14 | 15 |
| Material | SCM440H | SCM440H | SCM440H | SCM440H | SCM440H | SCM440H | SCM440H |
| Module (mm) | 2 | 2 | 2 | 2 | 2 | 2 | 2 |
| Number of Teeth | 60 | 60 | 60 | 60/24/144 2K-H planetary gear mechanism | 60 | 60 | 60 |
| Film Forming Method | AIP | AIP | AIP | AIP | AIP | AIP | AIP |
| H amount (atom %) | 0.1 | 0.1 | 0.1 | 0.1 | 0.1 | 0.1 | 0.1 |
| Lubricant | PAO + Palmitic acid monoglyceride | PAO + Stearic acid monoglyceride | PAO + Butyl stearate (Stearic acid butyl ester) | PAO | Gear oil | Gear oil + Stearic acid monoglyceride | Turbine oil + Stearic acid monoglyceride |
| Example Transmission Efficiency (%) | 97.9 | 98.4 | 97.7 | 93.3 | 95.5 | 96.7 | 94.7 |
| Comp. Example Transmission Efficiency (%) | 93.5 | 94.6 | 94.4 | 86.0 | 92.5 | 92.2 | 91.1 |

| | Example/Comp. Example | | | | | | |
|---|---|---|---|---|---|---|---|
| | 16 | 17 | 18 | 19 | 20 | 21 | 22 |
| Material | SCM440H | SCM440H | SCM440H | SCM440H | SCM440H | SCM440H | SCM440H |
| Module (mm) | 2 | 2 | 2 | 2 | 2 | 2 | 2 |
| Number of Teeth | 60 | 60 | 60 | 60 | 60 | 60 | 60 |
| Film Forming Method | AIP (Both Gears) | AIP | AIP | AIP | AIP | AIP | AIP |
| H amount (atom %) | 0.1 | 0.1 | 0.1 | 0.1 | 0.1 | 0.1 | 0.1 |
| Lubricant | PAO + Stearic acid monoglyceride | PAO + Stearic acid diglyceride | PAO + Pinacol | PAO + 1,10-decanediol | PAO + Dodecyl alcohol | Glycerin | Ethylene glycol |
| Example Transmission Efficiency (%) | 99.2 | 97.9 | 97.1 | 97.8 | 97.6 | 99.3 | 99.2 |
| Comp. Example Transmission Efficiency (%) | 94.6 | 93.2 | 93.2 | 93.3 | 93.7 | 92.7 | 91.6 |

Notes

AIP: arc ion plating process,

PAO: poly-alfa (α)-olefin.

This application is based on Japanese Patent Applications No. 2003-204238 filed on Jul. 31, 2003 and No. 2004-127632 filed on Apr. 23, 2004 in Japan. The entire contents of these Japanese Patent Applications are incorporated herein by reference.

Although the invention has been described above by reference to certain embodiments of the invention, the invention is not limited to the embodiments described above. Modifications and variations of the embodiments described above will occur to those skilled in the art, in light of the above teaching. The scope of the invention is defined with reference to the following claims.

What is claimed is:

1. A gear comprising:
   a tooth surface on the gear;
   a hard carbon film formed on at least a part of the tooth surface; and
   a lubricant in contact with the hard carbon film,
   wherein a main component of the lubricant is a hydroxyl-compound, and an amount of the hydroxyl-compound in the lubricant is greater than or equal to 85 percent by volume,
   wherein the hydroxyl-compound of the lubricant interacts synergistically with the hard carbon film of the tooth surface to improve a reduction of friction of the tooth surface, and
   wherein an amount of hydrogen in the hard carbon film is less than or equal to 1 atomic percent wherein the hydroxyl compound comprises glycerin or ethylene glycol.

2. The gear as claimed in claim 1, wherein the gear is a planetary gear mechanism gear.

3. The gear as claimed in claim 1, wherein the gear is a speed reduction mechanism gear.

4. The gear as claimed in claim 1, wherein the amount of hydrogen in the hard carbon film is less than or equal to 0.3 atomic percent.

* * * * *